United States Patent [19]

Kaplan

[11] 4,380,740
[45] Apr. 19, 1983

[54] CURRENT AMPLIFIER

[75] Inventor: Leonard A. Kaplan, Fords, N.J.
[73] Assignee: RCA Corporation, New York, N.Y.
[21] Appl. No.: 202,485
[22] Filed: Oct. 31, 1980
[51] Int. Cl.³ .............................................. H03F 3/18
[52] U.S. Cl. .................................... 330/288; 323/316
[58] Field of Search ................ 330/288; 323/315, 316; 307/297

[56] References Cited

U.S. PATENT DOCUMENTS

| Re. 29,910 | 2/1979 | Ahmed | 330/51 |
| 3,952,257 | 4/1976 | Schade, Jr. | 330/288 |
| 4,258,330 | 3/1981 | Kaneko et al. | 330/288 X |

FOREIGN PATENT DOCUMENTS 297800  4/1972  Austria .

OTHER PUBLICATIONS

Radovsky, "Current-Mirror Amplifiers Having Current Gains Less Influenced by the Base Currents of Component Transistors", *RCA Technical Note No. 949*, Dec. 31, 1973.
Schade, Jr., "Current-Mirror Amplifiers Having Current Gains Less Influenced by the Base Currents of Component Transistors", *RCA Technical Note 990*, Dec. 26, 1974.

*Primary Examiner*—James B. Mullins
*Attorney, Agent, or Firm*—Eugene M. Whitacre; Paul J. Rasmussen; Peter M. Emanuel

[57] ABSTRACT

A current amplifier having a gain factor substantially independent of the common emitter forward current gain (beta) of its component transistors uses a cascade arrangement of current mirror amplifiers (CMA's) to compensate for variations in beta. The output of a first CMA, which current transfer ratio thereof decreases as beta decreases, is connected to the input of a second CMA, which current transfer ratio thereof increases as beta decreases. The composite current gain of the combined first and second CMA's therefore tends to remain constant as the respective betas vary.

10 Claims, 4 Drawing Figures

CURRENT AMPLIFIER

FIELD OF THE INVENTION

The present invention relates to transistor current amplifiers wherein the gain of the current amplifier is substantially independent of the gain of its component transistors.

BACKGROUND OF THE INVENTION

The common emitter forward current gain (beta) of a bipolar transistor is not constant. Beta varies according to environmental factors, such as temperature and radiation level. Beta also varies according to operating conditions, such as collector current level and collector voltage level. Moreover, beta varies with semiconductor material and process variations, so that the beta of transistors on one semiconductor wafer can vary widely from that of the transistors fabricated on another semiconductor wafer.

Current mirror amplifiers (CMA's), which reduce the dependence of amplifier gain on beta, utilizing transistor geometry ratios, are well known. However, in these arrangements, the finite base currents drawn by the component bipolar transistors tend to introduce a base-current error term into a CMA transfer function such that the overall CMA gain is still a function of beta. The adverse effect of such base current error on CMA gain is exaggerated when lower beta transistors (e.g. such as lateral PNP transistors) are used, or when higher CMA current transfer ratios (e.g. current gains of ten or more) are desired.

The base-current error components in a CMA can be understood with reference, for example, to a simple CMA comprising first and second transistors, wherein a direct connection from the collector to the base electrode conditions the first transistor to conduct the input current. The base current for both first and second transistors is supplied by the amplifier input current via such collector-to-base connection. However, the amplifier output current at the collector electrode of the second transistor supplies no base current. As the beta of the individual transistors decreases, an increasing portion of the input current is diverted as base current to operate the first and second transistors. Thus, the gain of such simple CMA decreases as beta decreases. Such gain variations are particularly undesirable in drivers required to provide at least a minimum current for apparatus such as may be employed in automobiles since in such applications wide environmental variations are often encountered.

SUMMARY OF THE INVENTION

The present invention is embodied in a cascade arrangement of first and second CMA's wherein the output of the first CMA is an input to the second CMA. In one of the first and second CMA's, the gain thereof decreases as beta decreases. In the other of the first and second CMA's, the gain thereof increases as beta decreases. The composite gain of said first and second CMA's therefore tends to remain constant as beta decreases.

DETAILED DESCRIPTION

Figure 1:
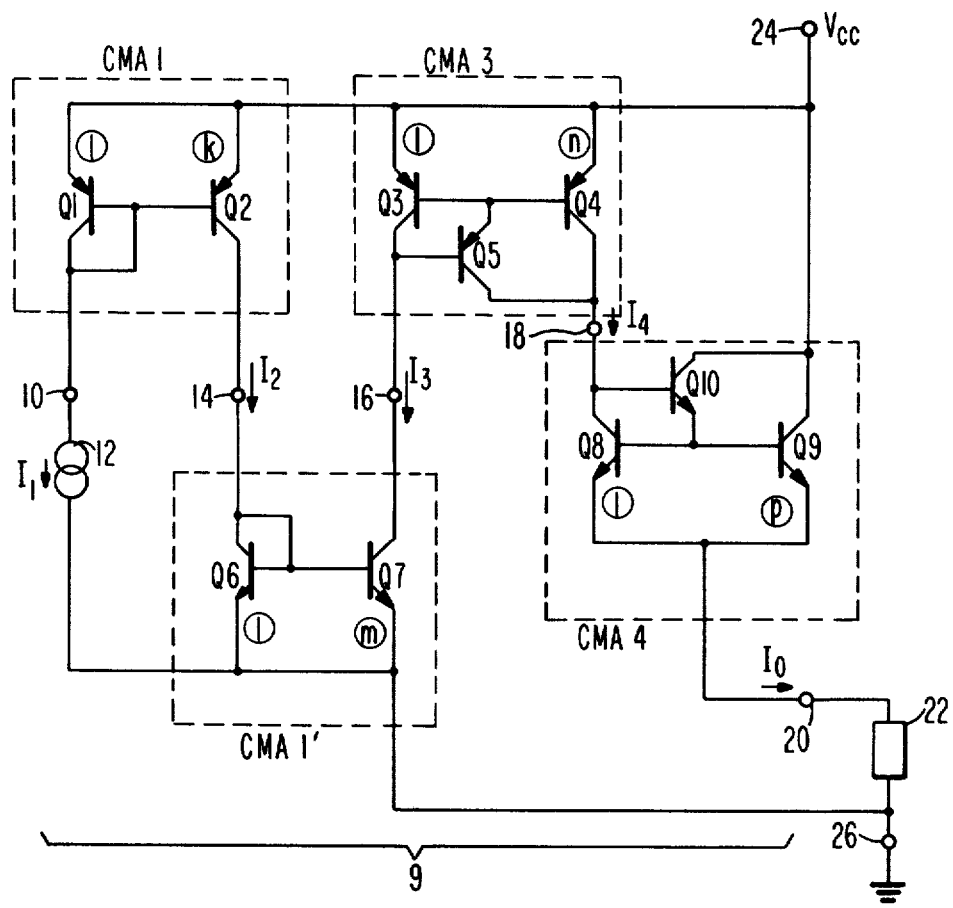
FIGS. 1 and 2 are each schematic diagrams of current amplifiers illustrating alternate embodiments of the present invention.

In FIG. 1, the current amplifier 9 receives an input signal current $I_1$ at terminal 10 supplied from a suitable signal source 12. The output terminal of current amplifier 9 is at terminal 20, where an output load 22 is connected to receive the output current $I_0$. The other end of the output load 22 is returned to a reference potential at terminal 26, in this case ground potential. An operating potential, $V_{CC}$, is applied to terminal 24.

The current amplifier 9 comprises a cascade connection of three inverting current mirror amplifiers (CMA 1, CMA 1' and CMA 3) and one non-inverting current amplifier (CMA 4). As is known, in an inverting CMA, the input and output signal currents are of opposite polarity. In a non-inverting CMA, the input and output signal currents have the same polarity.

Specifically, the output electrode of CMA 1 is connected to the input electrode of CMA 1' at terminal 14. The output electrode of CMA 1' is connected to the input electrode of CMA 3 at terminal 16. The output electrode of CMA 3 is connected to the input electrode of CMA 4 at terminal 18.

CMA 1 comprises PNP transistors Q1 and Q2. The emitter electrodes of transistors Q1 and Q2 are connected to $V_{CC}$ at terminal 24. Transistor Q1 is conditioned by a direct connection from collector to base electrodes thereof, to accept the input current $I_1$. The resulting base-emitter voltage ($V_{BE}$) of transistor Q1 is impressed across the base-emitter junction of transistor Q2.

Transistors Q1 and Q2 have matching transfer characteristics. Matching is achieved by fabricating transistors Q1 and Q2 by the same processing steps on the same semiconductor substrate. As a result, the base-emitter voltage to collector current transfer characteristics of transistors Q1 and Q2 tend to track each other over temperature variations. Further, as indicated in FIG. 1 by the circled ratio factors, the emitter-base junction area of transistor Q2 is k times that of transistor Q1. As a result, since transistors Q1 and Q2 have the same $V_{BE}$, the collector current of transistor Q2 is k times the collector current of Q1.

Assuming that the beta of transistors Q1 and Q2 is large enough so that the base current of transistors Q1 and Q2 can be neglected, the collector current of transistor Q1 is approximately equal to the input current $I_1$. Thus, the nominal current gain $I_2/I_1$ of CMA 1 is equal to k.

CMA 1' comprises NPN transistors Q6 and Q7. The emitter electrodes of transistors Q6 and Q7 are connected to terminal 26. Transistor Q6 is conditioned by a direct connection from collector to base electrodes thereof, to accept the input current $I_2$. The resulting $V_{BE}$ of transistor Q6 is also the $V_{BE}$ of transistor Q2. Since the base-emitter junction area of transistor Q7 is m times as large as that of Q6, the collector current of transistor Q7 is m times that of Q6. Assuming the base current of transistors Q6 and Q7 can be neglected, the nominal current gain of CMA 1' $I_3/I_2$ is equal to m.

CMA 3 comprises PNP transistors Q3, Q4, and Q5. The emitter electrodes of transistors Q3 and Q4 are connected to terminal 24. Transistor Q5 is arranged as an emitter follower amplifier to provide a collector-to-base feedback path for a transistor Q3 so as to condition transistor Q3 to accept the current $I_3$ applied at terminal 16. Since the base-emitter junction area of transistor Q4 is n times as large as that of Q3, and both transistors have substantially the same $V_{BE}$, the collector current of transistor Q4 is n times that of Q3. Assuming that the base currents of transistors Q3 and Q4 can be neglected, the nominal current gain of CMA 3 $I_4/I_3$ is equal to n.

CMA 4 comprises transistors Q8, Q9, and Q10. The emitter electrodes of transistors Q8 and Q9 are connected to output terminal 20. Transistor Q10 is arranged as an emitter follower amplifier to provide a collector-to-base feedback path for transistor Q8 so as to condition transistor Q8 to accept the input current $I_4$ applied at terminal 18. Since the base-emitter junction area of transistor Q9 is p times as large as that of Q8, and both transistors have the same $V_{BE}$, the collector current of Q9 is p times that of Q8. However, the output current $I_0$ of CMA 4 is the sum of the emitter currents of transistors Q8 and Q9. Therefore, assuming that the base currents of transistors Q8 and Q9 can be neglected, the nominal current gain of CMA 4 $I_0/I_4$ is equal to p+1.

The overall current gain for the current amplifier 9 is equal to the product of the current gains of the individual current mirror amplifiers CMA 1, CMA 1', CMA 3 and CMA 4. The nominal value for the current gain $I_0/I_1$ for current amplifier 9 is therefore equal to kmn(p+1). Cascaded CMA's are particularly useful when larger current gains are desired. By using several CMA's in cascade, the need for an excessively large area ratio in any one CMA is thereby avoided.

Up to this point, it has been assumed that the beta of the component transistors is large enough so that the base currents thereof can be neglected. However, in practical situations beta can be low enough so that the base currents can cause substantial deviation from nominal current gain.

For example, in CMA 1, the input current $I_1$ supplies not only the collector current of transistor Q1 but also the base currents of PNP transistors Q1 and Q2. However, the output current $I_2$ of CMA 1 supplies none of the required base currents. Therefore, as the beta of transistors Q1 and Q2 decreases, an increasing portion of the input current is diverted to supply the base currents of Q1 and Q2 so that the gain of CMA 1 decreases. Similarly, the gain of CMA 1' decreases as the beta of its respective transistors Q6 and Q7 decreases.

In contrast, the gains of CMA 3 and CMA 4 increase as the beta of their respective transistors decreases. This is so because the respective base currents, rather than being diverted from the input signal current, are substantially added to the output signal current.

In CMA 3, the base currents of transistors Q3 and Q4 are added to form the emitter current of transistor Q5. If the beta of transistor Q5 is greater than 1, most of the emitter current of transistor Q5 is added to the collector current of Q4 to form the output current $I_4$ of CMA 3. So long as a sufficiently small portion of the emitter current of transistor Q5, i.e., the base current of Q5, is added to the collector current of Q3 to form the input current $I_3$ of CMA 3, such collector current will not decrease substantially as the beta of transistors Q3 and Q4 decrease. Therefore, as the beta of transistors Q3 and Q4 decrease, most of the increased base current required to operate transistors Q3 and Q4 is added to the output current $I_4$ so that the gain of CMA 3 increases.

In CMA 4, the base currents of transistor Q8 and Q9 are supplied by the emitter current of transistor Q10. If the beta of transistor Q10 is greater than 1, most of the emitter current of transistor Q10 is supplied from the power supply at terminal 24 via the collector electrode of Q10. So long as a sufficiently small portion of the emitter current of transistor Q10, i.e. the base current of Q10, is added to the collector current of Q8 to form the input current $I_4$ of CMA 4, such collector current will not decrease substantially as the beta of transistor Q8 and Q9 decrease. Therefore, as the beta of transistors Q8 and Q9 decrease, most of the increased base current required to operate transistors Q8 and Q9 is drawn from the power supply via the collector electrode of Q10 and added to the output current $I_0$ so that the gain of CMA 4 increases.

In summary, the gain of CMA 1 and CMA 1' decreases while the gain of CMA 3 and CMA 4 increases as the respective betas of their component transistors decreases. Therefore, the composite gain of current amplifier 9 tends to remain constant as beta changes.

More specifically, it is noted that CMA 1 and CMA 3 are comprised of PNP transistors Q1 through Q4. The factors that affect the beta of one PNP transistor similarly affect the beta of all PNP transistors on the same substrate. Thus, the change in CMA 3 gain with respect to beta tends to compensate for the change in CMA 1 gain with respect to beta. Similarly, it is noted that CMA 4 and CMA 1' are comprised of NPN transistors Q6 through Q10. The factors that effect the beta of one NPN transistor similarly affect the beta of all NPN transistors on the same substrate. Thus, the change in CMA 4 gain with respect to beta tends to compensate for the change in CMA 1' gain with respect to beta.

Figure 2:
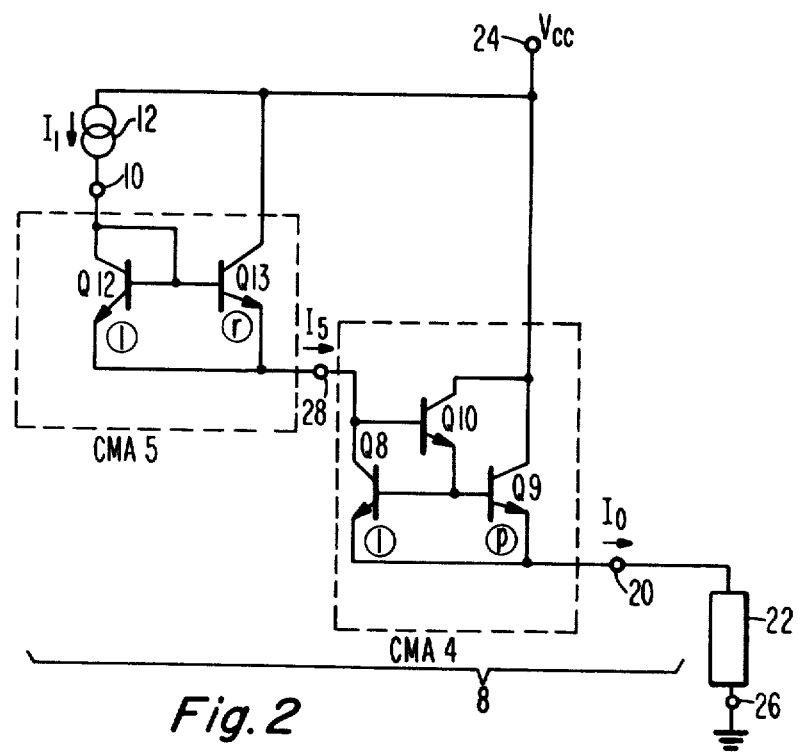

FIG. 2 shows a current amplifier 8 comprising a cascade connection of two non-inverting current mirror amplifiers, CMA 4 and CMA 5. CMA 4 is similar to CMA 4 of FIG. 1 and therefore is identified with the same reference numerals. The input signal source 12 supplies an input current $I_1$ to terminal 10 at the input applied of CMA 5. The output current $I_5$ from CMA 5 is applied to the input of CMA 4 at terminal 28. The output of CMA 4 supplies an output current $I_0$ to the output load 22 at terminal 20. The other end of the output load 22 is connected to ground at terminal 26.

CMA 5 comprises NPN transistors Q12 and Q13. The collector electrode of transistor Q13 is connected to $V_{CC}$ at terminal 24. The emitter electrode of transistors Q12 and Q13 are connected to terminal 28. Transistor Q12 is conditioned by a direct connection from collector to base electrodes thereof to accept the input current $I_1$. The resulting $V_{BE}$ of transistor Q12 is impressed across the base-emitter junction of transistor Q13. As indicated in FIG. 2, transistor Q13 is scaled r times as large as Q12. Since transistors Q12 and Q13 have the same $V_{BE}$, the collector current of transistor Q13 is r times as large as the collector current of transistor Q12.

The output current $I_5$ of CMA 5 is the sum of the emitter currents Q12 and Q13. Therefore, assuming that the base currents of transistors Q12 and Q13 can be neglected, the nominal current gain of CMA 5 $I_5/I_1$ is equal to (r+1). The operation of CMA 4 has been earlier described with reference to FIG. 1 and has a nominal current gain of (p+1). The cascade connection of CMA 5 and CMA 4 therefore has a nominal current gain of (r+1)(p+1). Note that even if all mirror transistors Q8, Q9, Q12, Q13 are the same size, the current amplifier 8 has a norminal gain of 4.

The nominal current gain $I_0/I_1$ of current amplifier 8 is substantially realized when the respective beta of transistors Q8, Q9, Q12 and Q13 are large enough so that corresponding base currents can be neglected. However, as the beta of transistors Q12 and Q13 decrease, the current gain $I_5/I_1$ of CMA 5 decreases. On the other hand, as the beta of transistors Q8 and Q9 decreases, the current gain $I_0/I_5$ of CMA 4 increases. Therefore, as the beta of respective component transistors decreases, the increased gain of CMA 4 tends to compensate for the decreased gain of CMA 5 so that the composite gain $I_0/I_1$ of current amplifier 8 tends to remain constant.

Figure 3:
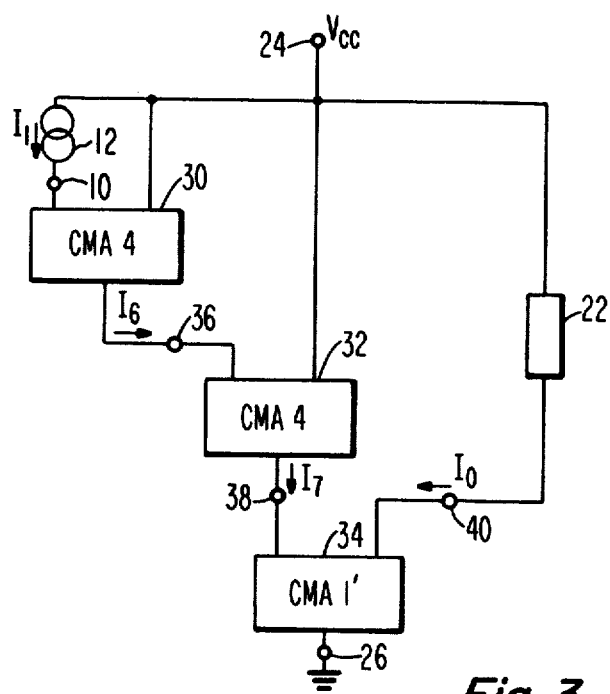
FIG. 3 is a block diagram of a current amplifier illustrating another embodiment of the present invention.

Yet another embodiment of a current amplifier constructed in accordance with the present invention is shown in FIG. 3. The input current $I_1$ is applied at terminal 10. The output load 22 is connected to terminal 40 for receiving an output current $I_0$. Whereas the respective current amplifiers shown in FIGS. 1 and 2 require at least 3 $V_{BE}$ potential between respective output terminals and respective supply terminals, the current amplifier of FIG. 3 requires only one $V_{BE}$ voltage drop between its output electrode 40 and ground terminal 26.

The current amplifier in FIG. 3 comprises three cascaded current mirrors 30, 32, and 34. The output electrode of the first CMA 30 is connected to the input of the second CMA 32 at terminal 36. The output of the second CMA 32 is connected to the input of the third CMA 34 at terminal 38.

The first and second CMA's 30, 32 are each similar to CMA 4 indicated in FIGS. 1 and 2. As the beta of respective component transistors decreases, the respective current gain $I_6/I_1$ and $I_7/I_6$ of the first and second CMA's 30, 32 increases. However, as the beta of respective component transistors decreases, the current gain $I_0/I_7$ of the third CMA 34 decreases. Thus, the increased gains of the first and second CMA's 30, 32 tends to compensate for the decreased current gain of the third CMA 34 so as to stabilize the composite current gain $I_0/I_1$ of all three cascaded CMA's as the beta of respective component transistors decreases.

Figure 4:
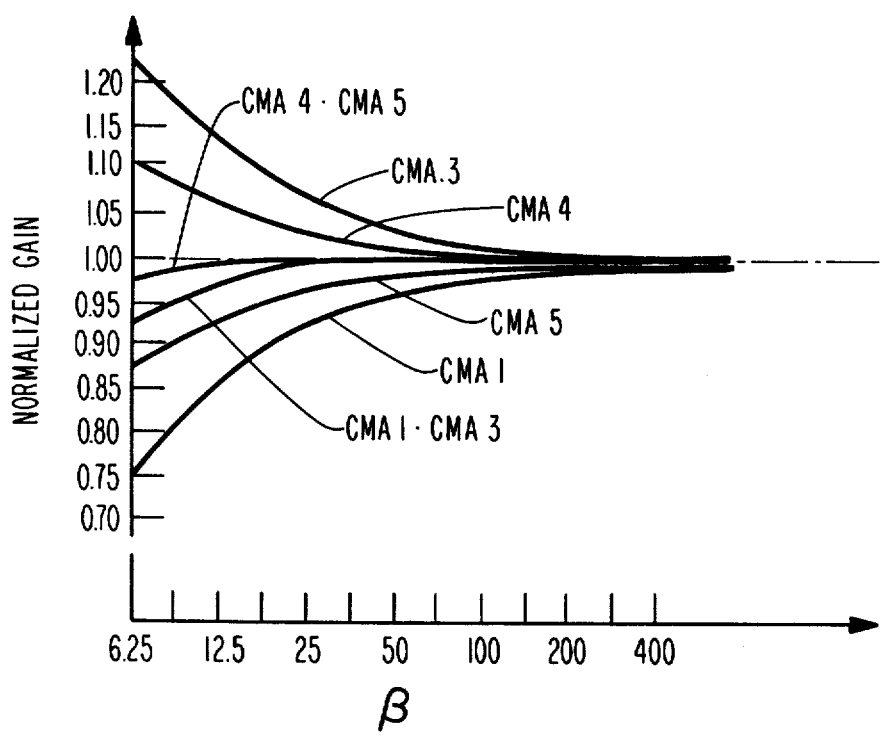
FIG. 4 is a graph illustrating the variation in normalized gain of particular CMA's shown in in FIGS. 1 and 2 as a function of the beta of respective component transistors.

The relationship between beta and CMA gain for the various CMA 1-5 of FIGS. 1-3 is illustrated graphically in FIG. 4. The vertical axis represents normalized current gain, which is defined as actual gain divided by nominal gain. The horizontal axis represents beta plotted on a logarithmic scale. As shown in the graph, the normalized gain for CMA 1 and CMA 5 tends to decrease as beta decreases. For example, the normalized gain of CMA 1 is very nearly 1.00 for a beta of 400, but falls to 0.75 at a beta of 6.25. The normalized gain for CMA 3 and CMA 4 tends to increase as beta decreases. For example, the normalized gain of CMA 3 is very nearly 1.00 at a beta of 400, but increases to approximately 1.22 at a beta of 6.25.

For all CMA characteristics plotted in FIG. 4, the area ratio between current mirror transistors is assumed to be unity. When the respective current mirror area ratio is greater than unity, even greater deviation from normalized gain can be expected.

The relationship between beta and gain for a current amplifier comprising a cascade connection of CMA 1 and CMA 3 is shown by the curve representing the product of CMA 1·CMA 3. Although the normalized gain of CMA 1 falls by about twenty-five percent and the normalized gain of CMA 3 increases by about twenty-two percent, the composite normalized gain for CMA 1·CMA 3 falls by about seven percent at a beta of 6.25.

The relationship between beta and amplifier gain for a current amplifier comprising a cascade connection of CMA 4 and CMA 5 is shown by the curve representing the product of CMA 4·CMA 5. While the normalized gain of CMA 5 falls by about thirteen percent, and the normalized gain of CMA 4 increases by about eleven percent, at a beta of 6.25, the composite normalized gain of a cascade connection of CMA 4 and CMA 5 falls by only about two percent at the same value for beta.

The relationship between beta and normalized current gain for CMA 1', while not specifically illustrated in FIG. 4, is similar to that for CMA 1. Note that the decrease from normalized gain for CMA 1 is greater than the decrease from normalized gain for CMA 4 at a given value of beta. Therefore, a cascade connection of two CMA 4's and one CMA 1' (as shown in FIG. 3) is advantageous. However, one CMA 4 having an area ratio greater than unity can provide adequate compensation when cascaded with one CMA 1'. As is known in the art, the current gain of a CMA may also be substantially determined by inserting emitter degeneration resistances, and proportioning the geometry of such resistances so as to set the ratio of such resistances.

Other combinations of cascaded CMAs will occur to one skilled in the art. For example, CMA 4 may be cascaded with CMA 1 to reduce the dependence of the resulting current amplifier gain on variations in beta.

Furthermore, other CMA configurations may be substituted for the CMA's shown. In CMA 1, for example, the direct collector to base connection for transistor Q1 may be replaced by an additional transistor with the base electrode thereof being connected to the collector electrode of transistor Q1, the emitter electrode thereof being connected to the base electrode of Q1 and the collector electrode thereof being connected to ground potential at terminal 26.

What is claimed is:

1. A current amplifier having input and output terminals comprising:
   a first current mirror amplifier having input and output electrodes, the input electrode thereof being connected to said input terminal;
   a second current mirror amplifier having respective input and output electrodes, the output electrode thereof being connected to said output terminal;
   means for connecting the output electrode of said first current mirror amplifier to the input electrode of said second current mirror amplifier;
   one of said first and second current mirror amplifiers comprising first and second transistors of like conductivity type having respective emitter, base and collector electrodes, means for connecting said collector electrode of said first transistor to said input electrode of said first current mirror amplifier; and means for connecting said first and second transistors as a current mirror amplifier wherein the current gain thereof decreases as the respective beta of said first and second transistors decrease; and
   the other of said first and second current mirror amplifiers comprising third and fourth transistors of like conductivity type having respective emitter, base, and collector electrodes, means for connecting said collector electrode of said third transistor to said input electrode of said second current mirror amplifier; and means for connecting said third and fourth transistors as a current mirror amplifier wherein the current gain thereof increases as the respective beta of said third and fourth transistors decreases.

2. A current amplifier according to claim 1 wherein said means for connecting said third and fourth transistors as a current mirror amplifier comprises:
current supply means connected to the respective collector electrodes of said third and fourth transistors for supplying the base currents of said third and fourth transistors so that a greater portion of said base currents is supplied at the collector electrode of said fourth transistor relative to that portion of said base currents supplied at the collector electrode of said third transistor.

3. A current amplifier according to claim 2 wherein said current supply means comprises:
a fifth transistor, having respective emitter, base, and collector electrodes, said emitter electrode thereof being connected to the base electrodes of said third and fourth transistors, said base electrode thereof being connected to the collector electrode of said third transistor, and said collector electrode thereof being connected to the collector electrode of said fourth transistor.

4. A current amplifier according to claim 3 wherein said means for connecting said first and second transistors as a current mirror amplifier comprises:
a connection between the respective base electrodes of said first and second transistors;
respective means for connecting the respective emitter electrodes of said first and second transistors to a first power supply potential;
means for connecting the collector electrode of said second transistor to said output electrode of said second current mirror amplifier; and
a direct connection without substantial intervening impedance between the collector and base electrodes of said first transistor.

5. A current amplifier according to claim 4 wherein said means for connecting said third and fourth transistors as a current mirror amplifier further comprises:
respective means for connecting the respective emitter electrodes of said third and fourth transistors to said first power supply potential;
means for connecting the collector electrode of said fourth transistor to said output electrode of said second current mirror amplifier.

6. A current amplifier according to claim 3 wherein said means for connecting said first and second transistors as a current mirror amplifier comprises:
a connection between the respective base electrodes of said first and second transistors;
means for connecting the collector electrode of said second transistor to a first power supply potential;
respective means for connecting the respective emitter electrodes of said first and second transistors to respective output electrode; and
a direct connection without substantial intervening impedance between the collector and base electrode of said first transistor.

7. A current amplifier according to claim 6 wherein said means for connecting said third and fourth transistors as a current mirror amplifier comprises:
means for connecting the collector electrode of said fourth transistor to said power supply potential; and
respective means for connecting the respective emitter electrodes of said third and fourth transistors to respective output electrode.

8. A current amplifier according to claim 5 wherein said means for connecting the output electrode of said first current mirror amplifier to the input electrode of said second current mirror amplifier comprises:
sixth and seventh transistors of like conductivity type having respective emitter, base, and collector electrodes, and means for connecting said sixth and seventh transistors as a third current mirror amplifier, that means comprising
a connection between the respective base electrodes of said sixth and seventh transistors;
respective means for connecting the respective emitter electrodes of said sixth and seventh transistors to a second power supply potential;
means for connecting the collector electrode of said sixth transistor to the output electrode of said first current mirror amplifier;
means for connecting the collector electrode of said seventh transistor to the input electrode of said second current mirror amplifier; and
a direct connection without substantial intervening impedance between the collector and base electrodes of said sixth transistor.

9. A current amplifier according to claim 8 wherein said connection between the output electrode of said second current mirror amplifier and said output terminal comprises:
eighth and ninth transistors, having respective emitter, base and collector electrodes, and means connecting said eighth and ninth transistors as a fourth current mirror amplifier, that means comprising
a connection between the respective base electrodes of said eighth and ninth transistors;
means for connecting the collector electrode of said ninth transistor to said first power supply potential;
means for connecting the collector electrode of said eighth transistor to the output electrode of said second current mirror amplifier;
respective means for connecting the respective emitter electrodes of said eighth and ninth transistors to said output terminal; and
a tenth transistor, having emitter, base, and collector electrodes, the base electrode thereof being connected to the collector electrode of said eighth transistor, the emitter electrode thereof being connected to the base electrode of said eighth and ninth transistors, and the collector electrode thereof being connected to the collector electrode of said ninth transistor.

10. An apparatus comprising:
a first current mirror amplifier including a first input transistor and a first output transistor each having a conduction path and a control electrode for controlling the conduction of said conduction path, first means for connecting said first input transistor and said first output transistor as said first current mirror amplifier so that said conduction path of said first input transistor conducts substantially all of a first input current and said conduction path of said first output transistor conducts a first output current, said first means supplying control currents to said control electrodes of said first input transistor and said first output transistor derived substantially from said first input current;

a second current mirror amplifier including a second input transistor and a second output transistor each having a conduction path and a control electrode for controlling the conduction of said conduction path, second means for connecting said second input transistor and said second output transistor as said second current mirror amplifier so that said conduction path of said second input transistor conducts substantially all of a second input current and said conduction path of said second output transistor conducts a second output current, said second means supplying control current to said control electrodes of said second input transistor and said second output transistor derived substantially from said second output current and being controlled in response to said second input current;

means for applying a signal current to one of said first and second current mirror amplifiers as said respective input current;

means for coupling the output current of said one current mirror amplifier to the other of said first and second current mirror amplifiers as said respective input current; and means for receiving said respective output current of said other current mirror amplifier and applying it to a load.

* * * * *